United States Patent
Manfrini et al.

(10) Patent No.: US 11,107,989 B2
(45) Date of Patent: Aug. 31, 2021

(54) MEMORY CELL WITH MAGNETIC LAYERS FOR RESET OPERATION

(71) Applicant: Taiwan Semiconductor Manufacturing Co., Ltd., Hsin-Chu (TW)

(72) Inventors: Mauricio Manfrini, Leuven (BE); Marcus Johannes Henricus van Dal, Linden (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 25 days.

(21) Appl. No.: 16/531,284

(22) Filed: Aug. 5, 2019

(65) Prior Publication Data

US 2021/0043837 A1 Feb. 11, 2021

(51) Int. Cl.
| | |
|---|---|
| *H01L 45/00* | (2006.01) |
| *G11C 13/00* | (2006.01) |
| *H01L 27/24* | (2006.01) |
| *H01L 43/02* | (2006.01) |

(52) U.S. Cl.
CPC ........ *H01L 45/147* (2013.01); *G11C 13/0097* (2013.01); *H01L 27/2436* (2013.01); *H01L 43/02* (2013.01); *H01L 45/1253* (2013.01); *H01L 45/141* (2013.01)

(58) Field of Classification Search
CPC . G11C 13/0097; H01L 27/2436; H01L 43/02; H01L 45/1253; H01L 45/141; H01L 45/147
See application file for complete search history.

(56) References Cited

U.S. PATENT DOCUMENTS

| | | | | |
|---|---|---|---|---|
| 6,114,719 | A | * | 9/2000 | Dill ..................... G11C 11/1675 257/295 |
| 2019/0043795 | A1 | * | 2/2019 | Chen ..................... H01L 21/768 |
| 2019/0058109 | A1 | * | 2/2019 | Chen ....................... H01L 45/04 |

OTHER PUBLICATIONS

Jana et al. "Conductive-Bridging Random Access Memory: Challenges and Opportunity for 3D Architecture." Nanoscale Research Letters (2015) 10:188, published on Apr. 18, 2015.

Kund et al. "Conductive Bridging RAM (CBRAM): An Emerging Non-Volatile Memory Technology Scalable to sub 20nm." IEEE International Electron Devices Meeting, 2005. IEDM Technical Digest, published on Apr. 3, 2006.

Tang et al. "Interfacial Exchange Coupling and Magnetization Reversal in Perpendicular [Co/Ni]N/TbCo Composite Structures." Scientific Reports | 5:10863 | DOI: 10.1038/srep10863, published on Jun. 15, 2015.

(Continued)

*Primary Examiner* — Allan R Wilson
(74) *Attorney, Agent, or Firm* — Eschweiler & Potashnik, LLC (57) ABSTRACT

Various embodiments of the present disclosure are directed towards a memory cell including a first ferromagnetic layer and a second ferromagnetic layer. A bottom electrode via overlies a substrate. A bottom electrode overlies the bottom electrode via. A data storage layer overlies the bottom electrode. The first ferromagnetic layer overlies the data storage layer and has a first magnetization pointing in a first direction. The second ferromagnetic layer overlies the bottom electrode via and has a second magnetization pointing in a second direction orthogonal to the first direct.

20 Claims, 8 Drawing Sheets

(56) References Cited

OTHER PUBLICATIONS

Shukla et al. "Fundamental Mechanism Behind Volatile and Non-Volatile Switching in Metallic Conducting Bridge RAM." 2017 IEEE International Electron Devices Meeting (IEDM), published on Jan. 25, 2018.

* cited by examiner

MEMORY CELL WITH MAGNETIC LAYERS FOR RESET OPERATION

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random access memory (RRAM) is one promising candidate for next generation non-volatile memory technology due to its simple structure and compatibility with complementary metal-oxide semiconductor (CMOS) logic processes. An RRAM cell includes a dielectric data storage layer having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage layer (e.g., an oxide layer) arranged between top and bottom electrodes. A variable resistance of the data storage layer represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

Before an RRAM device can be used to store data, an initial conductive path (i.e., conductive filament) is typically formed across the data storage layer. Formation of the initial conductive path makes subsequent write operations (that form the conductive path) easier to perform. To form the initial conductive path, at the end of the RRAM manufacturing process a forming voltage is applied across the top and bottom electrodes. In some types of RRAM devices, the conductive paths may be a combination of oxygen vacancies and conductive ions. In such devices the forming voltage may knock oxygen atoms out of a lattice of the data storage layer, thereby forming localized oxygen vacancies. Additionally, the forming voltage may knock top electrode ions (e.g., cobalt ions) from the top electrode to the data storage layer. These localized oxygen vacancies and top electrode ions tend to align to form the conductive path which extends through the data storage layer. Thereafter, set or reset voltages can be applied across the top and bottom electrodes to change resistivity of the data storage layer. For example, when a reset voltage is applied, oxygen ions move back to the data storage layer and top electrode ions move back to the top electrode, thereby filling oxygen vacancies and breaking the conductive path to increase resistivity. In yet another example, when a set voltage is applied, oxygen ions in the data storage layer move to the top electrode and top electrode ions from the top electrode move to the data storage layer, thereby leaving oxygen vacancies and re-forming the conductive path to lower resistivity.

In an RRAM device, the top electrode may be typically copper or tungsten. However, over time copper or tungsten atoms within a top electrode will diffuse into the adjacent data storage layer due to electromigration, leading to failure of the device. To prevent this, one or more diffusion barriers may be introduced between the data storage layer and the top electrode. However, the diffusion barriers may negatively affect performance of the memory device. To prevent this negative impact on performance, barrier-less top electrodes can be formed from a ferromagnetic material (e.g., cobalt). However, it has been appreciated that after performing a number (e.g., about $10^6$ to $10^8$) of set and/or reset operations, ions from such top electrodes may build up in the data storage layer so that the set voltage is unable to push the top electrode ions from the data storage layer to the top electrode. This, in part, mitigates an ability for the RRAM cell to switch out of the lower resistance state, thereby decreasing discrete data states, an endurance, and a reliability of the RRAM cell.

The present application, in some embodiments, is directed to a semiconductor structure for a RRAM cell that includes a first ferromagnetic layer and a second ferromagnetic layer. The first ferromagnetic layer is disposed over the data storage layer, and the second ferromagnetic layer is disposed beneath the bottom electrode. A first magnetization of the first ferromagnetic layer is orthogonal to a second magnetization of the second ferromagnetic layer. The magnetic force generated by the orthogonal relationship of the first and the second magnetizations overcomes a bond between the ferromagnetic ions of a top electrode that are in the data storage layer (e.g., the magnetic force is great enough to break the aforementioned bond). This, in part, pushes the ferromagnetic ions back to the first ferromagnetic layer and prevents the build up of ions from the top electrode within the data storage layer. Therefore, the first ferromagnetic layer and the second ferromagnetic layer increase a number (e.g., greater than $10^8$) of set and reset operations that may be performed on the RRAM cell. Thus, increasing discrete data states, an endurance, and a reliability of the RRAM cell.

Figure 1:
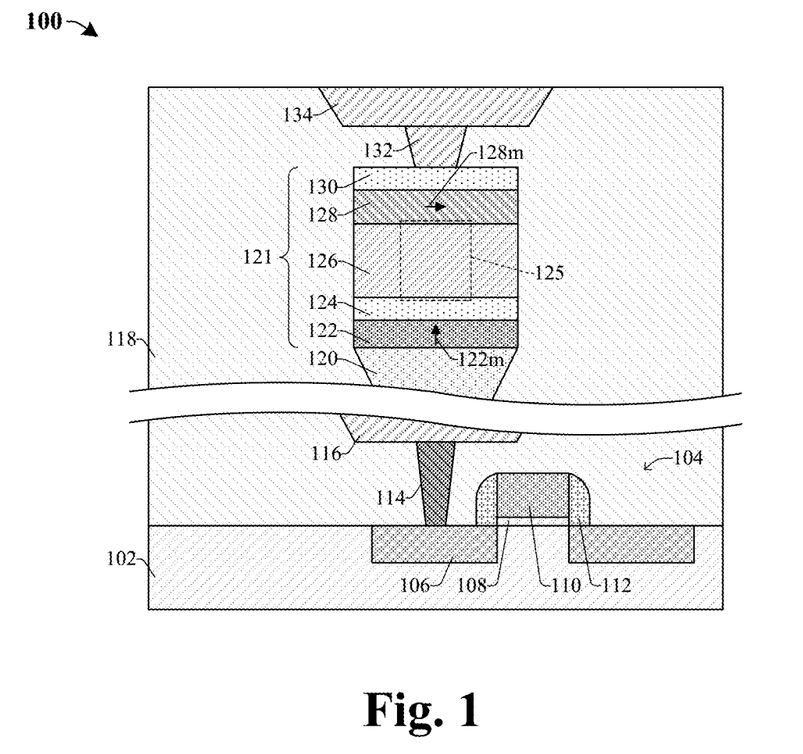
FIG. 1 illustrates a cross-sectional view of some embodiments of a memory device including first and second ferromagnetic layers, according to the present disclosure.

Referring to FIG. 1, a cross-sectional view of some embodiments of a memory device 100 including a memory cell 121 that has a first ferromagnetic layer 128 and a second ferromagnetic layer 122 is provided.

The memory device 100 includes the memory cell 121 disposed over a substrate 102. An interconnect dielectric structure 118 comprising one or more inter-level dielectric (ILD) materials overlies the substrate 102. An access transistor 104 is within the substrate 102 and the interconnect dielectric structure 118. The access transistor 104 includes a gate electrode 110, a transistor sidewall spacer 112, a gate dielectric 108, and source/drain regions 106. One or more lower interconnect layers underlie the memory cell 121. The one or more lower interconnect layers include a conductive contact 114, an interconnect wire 116, and a bottom electrode via 120. For example, the memory cell 121 is electrically coupled to the access transistor 104 via a conductive contact 114 and an interconnect wire 116. A bottom electrode via 120 is disposed between the interconnect wire 116 and the memory cell 121.

The memory cell 121 includes the second ferromagnetic layer 122, a bottom electrode 124, a data storage layer 126, the first ferromagnetic layer 128, and a top electrode 130. The second ferromagnetic layer 122 is disposed beneath the bottom electrode 124 and comprises a second magnetic material (e.g., iron, nickel, or cobalt, or any/similar ferromagnetic alloy). The bottom electrode 124 is disposed between the data storage layer 126 and the second ferromagnetic layer 122. The first ferromagnetic layer 128 is disposed above the data storage layer 126 and comprises a first magnetic material (e.g., cobalt). In some embodiments, the first magnetic material is different than the second magnetic material. In further embodiments, the first magnetic material is the same as the second magnetic material. In some embodiments, the top electrode 130 overlies the first ferromagnetic layer 128 and is electrically coupled to an upper interconnect wire 134 through an upper interconnect via 132. In other embodiments (not shown), the first ferromagnetic layer 128 is the top electrode (e.g., top electrode 130 is omitted). In such embodiments, the upper interconnect via 132 may directly contact a top of the first ferromagnetic layer 128. In some embodiments, the memory cell 121 may be configured as a resistive random access memory (RRAM), such that the data storage layer 126 comprises a material having a variable resistance configured to undergo a reversible phase change between a high resistance state and a low resistance state.

During operation, the memory cell 121 relies on redox reactions to form and dissolve a conductive path in a region 125 of the data storage layer 126 between the first ferromagnetic layer 128 and the bottom electrode 124. The existence of the conductive path in the region 125 between the first ferromagnetic layer 128 and the bottom electrode 124 produces a low resistance state, while the absence of the conductive path in the region 125 results in a high resistance state. Thus, the memory cell 121 can be switched between the high resistance state and low resistance state by applying appropriate biases to the memory cell 121 to produce or dissolve the conductive path in the region 125.

To increase a number of switching cycles that may be performed on the memory cell 121, the first ferromagnetic layer 128 has a first magnetization 128m orthogonal to a second magnetization 122m of the second ferromagnetic layer 122. In some embodiments, the first magnetization 128m points in a first direction that is parallel to a bottom surface of the data storage layer 126, and the second magnetization 122m points in a second direction that is orthogonal to the bottom surface of the data storage layer 126, such that the second magnetization 122m is orthogonal to the first magnetization 128m. In some embodiments, the first and second magnetizations 128m, 122m are "fixed", such that their orientations will not change while and/or after performing a set operation and/or a reset operation on the memory cell 121. During removal of the conductive path in region 125 (i.e., a "reset" operation), the magnetic force generated by the orthogonal relationship of the first and second magnetizations 128m, 122m overcomes a bond strength between ferromagnetic ions and atoms in the data storage layer 126. Thus, the orthogonal relationship of the first and second magnetizations 128m, 122m enhances an ability of the memory cell 121 to dissolve and/or remove the conductive path in the region 125. This, in part, increases a number of switching cycles (e.g., greater than $10^8$) that may be performed on the memory cell 121, while maintaining discrete data states and reliability of the memory cell 121.

Figure 2:
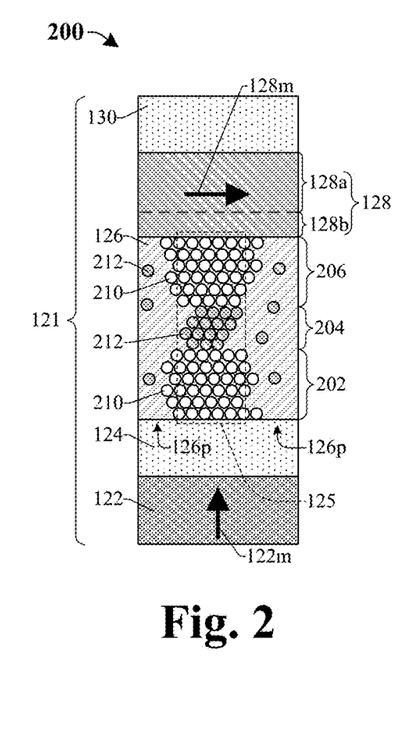
FIGS. 2-4 illustrate cross-sectional views of some embodiments of operating a memory device including first and second ferromagnetic layers, according to the present disclosure.
Figure 3:
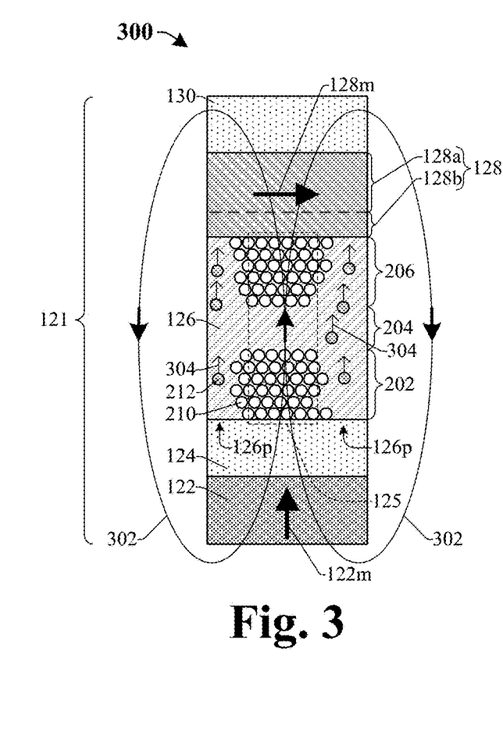
Figure 4:
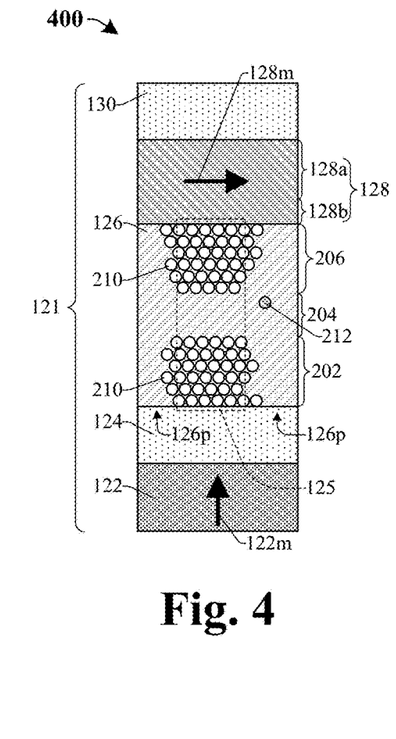

Referring to FIGS. 2-4, cross-sectional views of some embodiments of different states of the memory cell 121 of FIG. 1 are provided. In some embodiments, FIG. 2 illustrates a first state 200, in which the memory cell 121 is in a low resistance state (e.g., storing a logical "1"). Further, FIG. 3 illustrates a second state 300, in which the memory cell 121 is in a transient state (i.e., an intermediate state between the low resistance state and a high resistance state). Furthermore, FIG. 4 illustrates a third state 400, in which the memory cell 121 is in the high resistance state (e.g., storing a logical "0").

Although FIGS. 2-4 describe a memory cell as having a conductive path formed of oxygen vacancies and conductive ions, it will be appreciated that the disclosed ferromagnetic layers are not limited to memory devices having such paths. For example, in some embodiments, the ferromagnetic layers may be used in memory devices having a conductive path that is formed of conductive ions and not oxygen vacancies.

FIG. 2 illustrates one embodiment of the first state 200 of the memory cell 121, in which a set operation was performed on the memory cell 121. The memory cell includes a first ferromagnetic layer 128. In some embodiments, the first ferromagnetic layer 128 may include a metal layer 128a (e.g., comprising cobalt) overlying a metal oxide layer 128b (e.g., comprising cobalt oxide ($Co_xO_y$)). In some embodiments, during the set operation, the metal oxide layer 128b is configured to receive oxygen ions from the data storage layer 126, thereby forming vacancies 210 in the data storage layer. Further, in the aforementioned embodiment, ferromagnetic ions 212 (e.g., cobalt ions) from the metal oxide layer 128b are configured to enter the data storage layer 126. Thus, after the set operation, the memory cell 121 is in a low resistance state, and a conductive path is formed within a center region 125 of the data storage layer 126. In some embodiments, the conductive path within the center region 125 electrically couples the first ferromagnetic layer 128 to the bottom electrode 124. The conductive path may include: vacancies 210 (e.g., oxygen vacancies) in a lower region 202 of the data storage layer 126; ferromagnetic ions 212 (e.g., from the first ferromagnetic layer 128) in a middle region 204 of the data storage layer 126; and vacancies 210 in an upper region 206 of the data storage layer 126. The middle region 204 is disposed between the upper region 206 and the lower region 202. In some embodiments, ferromagnetic ions 212 are in a peripheral region 126p of the data storage layer, such that the peripheral region 126p surrounds the conductive path in the center region 125. In some embodiments, the bottom electrode 124 comprises a material that may facilitate formation of the vacancies 210 in the lower region 202 and/or the upper region 206. In some embodiments, the bottom electrode 124 may comprise a non-magnetic material, such that the bottom electrode 124 and the first ferromagnetic layer 128 comprise different conductive materials.

FIG. 3 illustrates one embodiment of a second state 300 of the memory cell 121, in which the memory cell 121 is in a transient state. For example, the second state 300 represents a snapshot of the memory cell 121 while applying appropriate reset bias conditions between the top electrode 130 and the second ferromagnetic layer 122. The ferromagnetic ions 212 in the center region 125 of FIG. 2 have moved back to the first ferromagnetic layer 128. The magnetic field lines 302 are a result of the orthogonal relationship of the first and second magnetizations 128m, 122m. A generated magnetic force from the orthogonal relationship pushes the ferromagnetic ions 212 in the peripheral region 126p and/or the center region 125 (not shown) of the data storage layer 126 to the first ferromagnetic layer 128 (as illustrated by the arrows 304 extending from the ferromagnetic ions 212). Therefore, the generated magnetic force from the first and second ferromagnetic layers 128, 122 assists in moving the ferromagnetic ions 212 from the data storage layer 126 to the first ferromagnetic layer 128 during the reset operation.

FIG. 4 illustrates one embodiment of the third state 400 of the memory cell 121, in which a reset operation was performed on the memory cell 121. In some embodiments, the third state 400 is the state of the memory cell 121 after applying the reset bias conditions between the top electrode 130 and the second ferromagnetic layer 122. A majority of the ferromagnetic ions 212 in the center region 125 and in the peripheral region 126p have moved back to the first ferromagnetic layer 128. In some embodiments, the generated magnetic force from the orthogonal relationship assisted and/or ensured the majority of ferromagnetic ions 212 in the peripheral region 126p moved back to the first ferromagnetic layer 128. This, in part, places the memory cell 121 in a high resistance state.

In some embodiments, after applying the reset bias conditions, all of the ferromagnetic ions 212 in the data storage layer 126 are pushed back to the first ferromagnetic layer 128 (not shown). By moving the majority and/or all of ferromagnetic ions 212 from the data storage layer 126 to the first ferromagnetic layer 128 during a reset operation, discrete data states of the memory cell 121 are enhanced and a number of switching cycles (e.g., switching from the first state 200 to the third state 400, or vice versa) that may be performed on the memory cell 121 are increased, thereby increasing a reliability of the memory cell 121.

Figure 5:
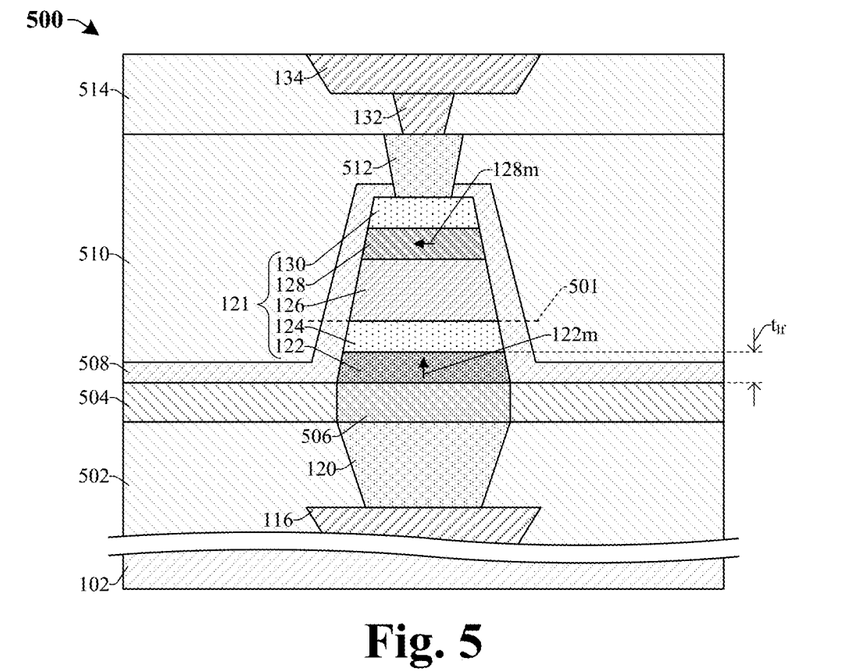
FIGS. 5-8 illustrate cross-sectional views of some alternative embodiments of the memory device of FIG. 1, according to the present disclosure.

Referring to FIG. 5, a cross-sectional view of a memory device 500 corresponding to some alternative embodiments of the memory device 100 of FIG. 1 is provided.

The memory device 500 includes a substrate 102 and a memory cell 121. The memory cell 121 overlies the substrate 102. The substrate 102 may, for example, be a bulk substrate (e.g., a bulk monocrystalline silicon substrate) or a silicon-on-insulator (SOI) substrate. An inter-level dielectric (ILD) structure 502 overlies the substrate 102. In some embodiments, the ILD structure 502 may comprise multiple ILD layers and/or multiple dielectric materials. An interconnect wire 116 is disposed in the ILD structure 502 and overlies the substrate 102. A bottom electrode via 120 extends from a seed layer 506 to the interconnect wire 116. In some embodiments, the seed layer 506 is configured to facilitate forming the second ferromagnetic layer 122 over the bottom electrode via 120. In some embodiments, the interconnect wire 116 may, for example, be or comprise copper, aluminum, or the like. The bottom electrode via 120 may, for example, be or comprise copper, aluminum, tungsten, or the like. In some embodiments, the multiple dielectric materials may, for example, be or comprise silicon dioxide, a low κ dielectric material, or the like. As used herein, a low κ dielectric material is a dielectric material with a dielectric constant less than 3.9.

A dielectric layer 504 overlies the ILD structure 502 and surrounds the seed layer 506. The memory cell 121 overlies the seed layer 506, such that the memory cell 121 is electrically coupled to the interconnect wire 116. A sidewall spacer 508 overlies the dielectric layer 504 and the memory cell 121. A first ILD layer 510 overlies the sidewall spacer 508, and a second ILD layer 514 overlies the first ILD layer 510. A top electrode via 512 extends from an upper interconnect via 132 through the first ILD layer 510 to a top surface of the memory cell 121. An upper interconnect wire 134 is disposed in the second ILD layer 514 and overlies the upper interconnect via 132.

The memory cell 121 includes a second ferromagnetic layer 122, a bottom electrode 124, a data storage layer 126, a first ferromagnetic layer 128, and a top electrode 130. In some embodiments, a capping layer (not shown) is disposed between the top electrode 130 and the first ferromagnetic layer 128 and may be or comprise ruthenium, titanium nitride, or the like. The first ferromagnetic layer 128 is disposed between the data storage layer 126 and the top electrode 130. The first ferromagnetic layer 128 comprises a first magnetic material (e.g., cobalt) with a first magnetization 128m pointing in a first direction. In some embodiments, the first direction points to the left. In some embodiments, the first direction is parallel to a horizontal line 501. A bottom surface of the data storage layer 126 may be disposed along the horizontal line 501. The second ferromagnetic layer 122 is disposed between the bottom electrode 124 and the seed layer 506. The second ferromagnetic layer 122 comprises a second magnetic material (e.g., nickel) with a second magnetization 122m pointing in a second direction. In some embodiments, the second direction is perpendicular to the horizontal line 501, such that the first direction is perpendicular to the second direction. Thus, the second direction is orthogonal to the bottom surface of the data storage layer 126. In some embodiments, the first magnetic material and the second magnetic material are the same (e.g., cobalt). In some embodiments, the first magnetic material (e.g., cobalt) is different than the second magnetic material (e.g., nickel).

In some embodiments, the data storage layer 126 may, for example, be or comprise a transitional metal oxide comprising one or more layers of hafnium oxide ($HfO_x$), aluminum oxide ($AlO_x$), tantalum oxide ($TaO_x$), or a hygroscopic oxide comprising one or more layers of lanthanum oxide ($La_xO_x$), lanthanum silicon oxide (LaSiO), strontium titanate ($SrTiO_3$), or another suitable dielectric, such as silicon nitride (e.g., $Si_3N_4$), a high κ dielectric material, or any combination of the aforementioned. In further embodiments, the data storage layer 126 may, for example, be or comprise a chalcogenide, such as germanium selenium tellurium (GeSeTe), germanium selenium (GeSe), germanium tellurium (GeTe), or the like. As used herein, a high κ dielectric material is a dielectric material with a dielectric constant greater than 3.9. In some embodiments, the data storage layer 126 may have a thickness within a range of 1 to 30 nanometers. In some embodiments, the first ferromagnetic layer 128 may, for example, be or comprise a magnetic material, such as cobalt, nickel, iron, an alloy of the aforementioned magnetic materials, or the like and/or has a thickness within a range of 2 to 50 nanometers. In some embodiments, the bottom electrode 124 may, for example, be or comprise copper, ruthenium, tantalum, titanium, tantalum nitride, titanium nitride, platinum, silver, iridium, a combination of the aforementioned, or the like and/or may have a thickness within a range of approximately 2 to 50 nanometers. In some embodiments, the top electrode 130 may, for example, be or comprise titanium, tantalum, tungsten, or the like.

In some embodiments, the second ferromagnetic layer 122 may, for example, be or comprise cobalt, nickel, iron, an alloy of the aforementioned, terbium cobalt, iron platinum, or the like and/or has a thickness of within a range of 5 to 20 nanometers. The thickness $t_{if}$ is directly proportional to a magnetic force generated by the second ferromagnetic layer 122. For example, if the thickness $t_{if}$ is 5 nanometers or greater, then the magnetic force generated by the second ferromagnetic layer 122 may be great enough to overcome a bond between ferromagnetic ions (212 of FIGS. 2-4) and atoms in the data storage layer 126 (i.e., the magnetic force is great enough to break the aforementioned bond). In another example, if the thickness $t_{if}$ is 20 nanometers or less, then the magnetic force generated by the second ferromagnetic layer 122 is great enough to overcome the bond between ferromagnetic ions (212 of FIGS. 2-4) and atoms in the data storage layer 126, while mitigating costs and time associated with forming the second ferromagnetic layer 122. Further, the generated magnetic force from the second ferromagnetic layer 122 increases a number of switching cycles that may be performed on the memory cell 121, thereby increasing a reliability of the memory cell 121.

Figure 6:
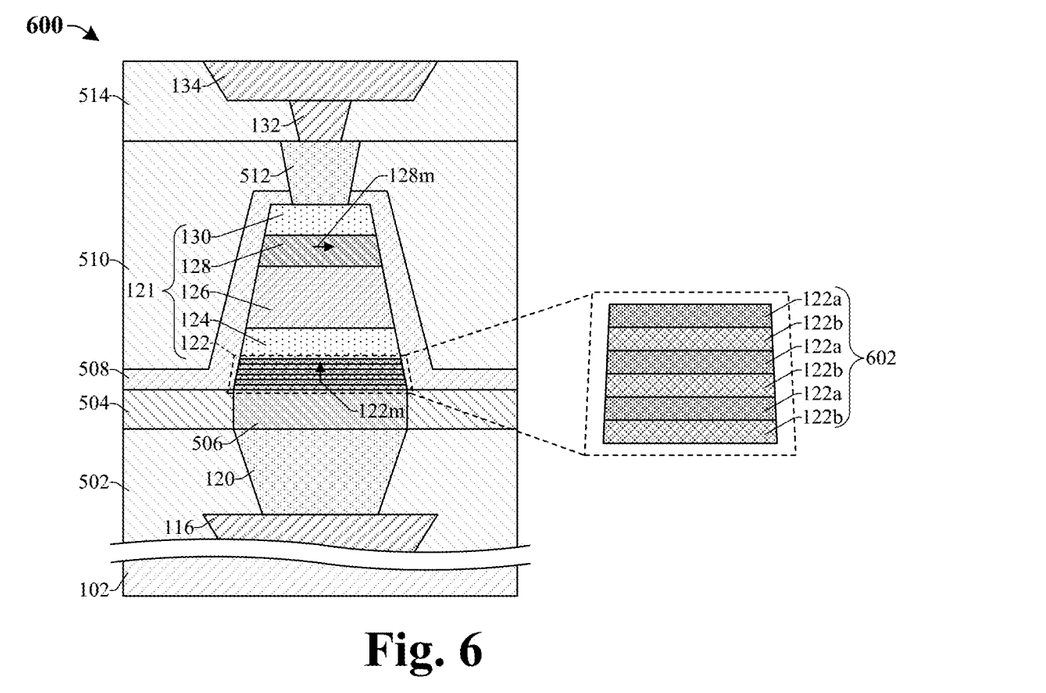

Referring to FIG. 6, a cross-sectional view of a memory device 600 corresponding to some alternative embodiments of the memory device 500 of FIG. 5 is provided.

The second ferromagnetic layer 122 includes a multilayer stack 602. The multilayer stack 602 may comprise an alternating stack of a first conductive material 122a overlying a second conductive material 122b. The second magnetization 122m is achieved by stacking the first conductive material 122a over the second conductive material 122b, such that a magnetic force generated by the multilayer stack 602 is proportional to an overall thickness of the multilayer stack 602 and/or the materials within the multilayer stack 602. The first conductive material 122a may, for example, be or comprise cobalt iron, or the like and/or may have a thickness within a range of 0.1 to 5 nanometers. The second conductive material 122b may, for example, be or comprise nickel, platinum, palladium, or the like and/or may have a thickness within a range of 0.1 to 5 nanometers. In some embodiments, the multilayer stack 602 may include 1 to 100 pairs of the first and second conductive materials 122a, 122b. In some embodiments, the first conductive material 122a is configured as and/or comprises a first magnetic material and the second conductive material 122b is configured as and/or comprises a second magnetic material. In some embodiments, the first conductive material 122a comprises a magnetic material different than a magnetic material of the second conductive material 122b. In further embodiments, the first ferromagnetic layer 128 comprises a single magnetic material (e.g., cobalt).

In some embodiments, the multilayer stack 602 may comprise an alternating stack of a magnetic materials and a non-magnetic material. For example, the first conductive material 122a may be or comprise a magnetic material, and the second conductive material 122b may be or comprise a non-magnetic material. In such embodiments, the magnetic material may, for example, be or comprise iron, nickel, cobalt, a combination of the foregoing, or the like, and the non-magnetic material may, for example, be or comprise platinum, palladium, or the like. Further, an intercalation of the magnetic material and the non-magnetic material is magnetic and may generate a magnetic force.

Figure 7:
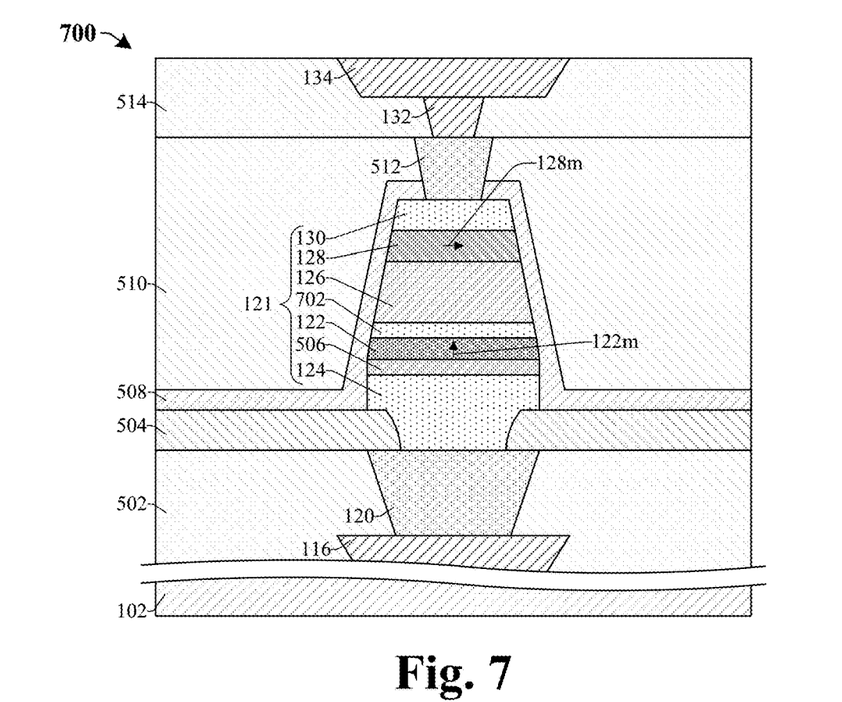

Referring to FIG. 7, a cross-sectional view of a memory cell 700 corresponding to some alternative embodiments of the memory device 500 of FIG. 5 is provided.

The bottom electrode 124 is disposed between the second ferromagnetic layer 122 and the bottom electrode via 120. The bottom electrode 124 extends from above the top surface of the dielectric layer 504 to the bottom electrode via 120. The seed layer 506 overlies the bottom electrode 124 and the second ferromagnetic layer 122 overlies the seed layer 506. A metal layer 702 is disposed between the data storage layer 126 and the second ferromagnetic layer 122. In some embodiments, the metal layer 702 may be configured to form vacancies in the data storage layer 126 during a forming process performed on the memory cell 121. In some embodiments, the metal layer 702 may, for example, be or comprise copper, ruthenium, tantalum, titanium, tantalum nitride, titanium nitride, platinum, silver, iridium, a combination of the aforementioned, or the like and/or may have a thickness within a range of approximately 2 to 50 nanometers.

Figure 8:
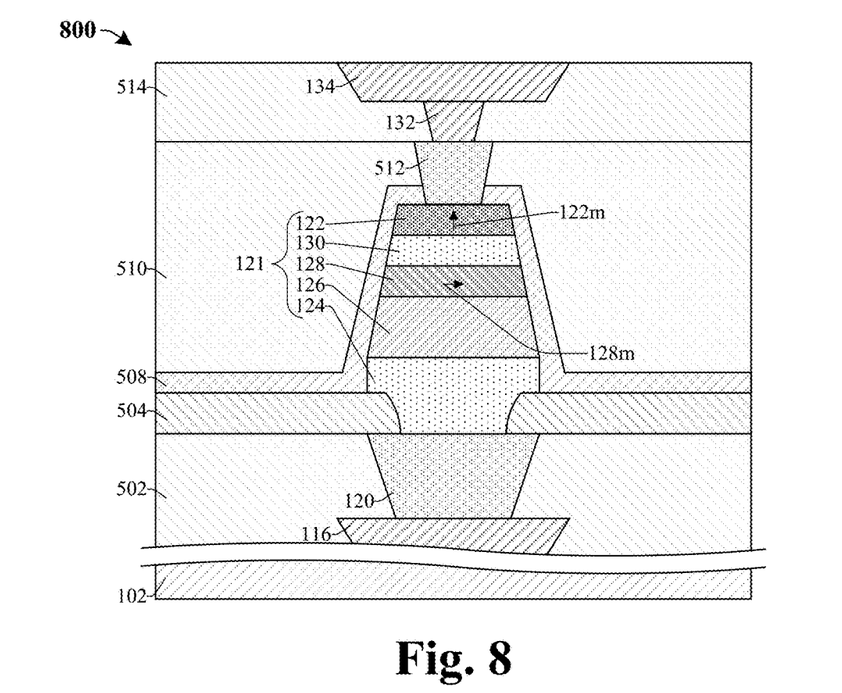

Referring to FIG. 8, a cross-sectional view of a memory cell 800 corresponding to some alternative embodiments of the memory device of FIG. 5 is provided.

The second ferromagnetic layer 122 is disposed between the top electrode via 512 and the first ferromagnetic layer 128. In some embodiments, a seed layer (not shown) is disposed between the second ferromagnetic layer 122 and the bottom electrode 124.

FIGS. 9-15 illustrate cross-sectional views 900-1500 of some embodiments of a method of forming a memory device including a memory cell according to the present disclosure. Although the cross-sectional views 900-1500 shown in FIGS. 9-15 are described with reference to a method, it will be appreciated that the structures shown in FIGS. 9-15 are not limited to the method but rather may stand alone separate of the method. Although FIGS. 9-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 9:
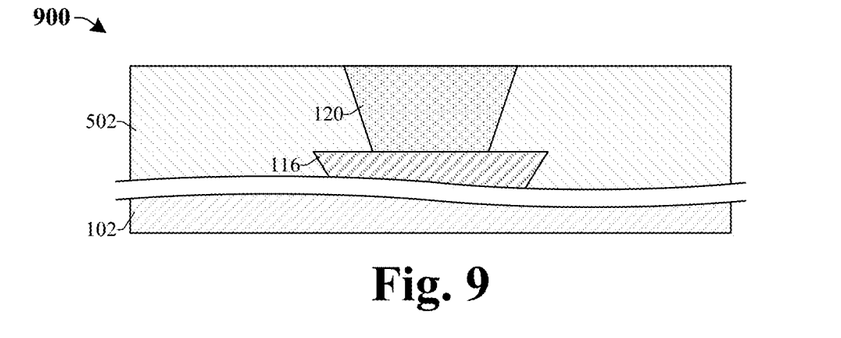
FIGS. 9-15 illustrate cross-sectional views of some embodiments of a method of forming a memory device including first and second ferromagnetic layers, according to the present disclosure.

As shown in cross-sectional view 900, an inter-level dielectric (ILD) structure 502 is formed over a substrate 102. An interconnect wire 116 is formed within the ILD structure 502. In some embodiments, the interconnect wire 116 may be formed by way of a damascene process. A bottom electrode via 120 is formed within the ILD structure 502 and overlies the interconnect wire 116. In some embodiments, the above layers and/or structures may be formed by using a deposition process such as, for example, chemical vapor deposition (CVD), physical vapor deposition (PVD), some other suitable deposition process(es), or any combination of the foregoing.

Figure 10:
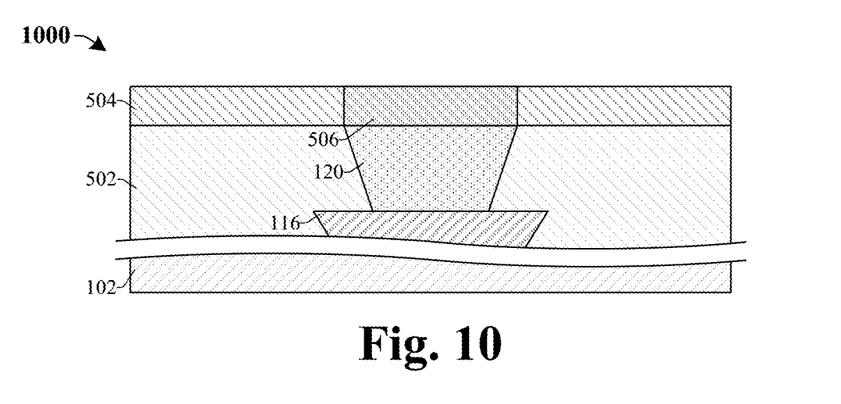

As shown in cross-sectional view 1000, a dielectric layer 504 is formed over the ILD structure 502. A seed layer 506 is formed within the dielectric layer 504 over the bottom electrode via 120. In some embodiments, the seed layer 506 may be formed by way of a damascene process. For example, a process for forming the seed layer 506 may include: patterning the dielectric layer 504 to form a seed layer opening over the bottom electrode via 120; forming a seed layer material within the seed layer opening; and performing a planarization process on the seed layer material until an upper surface of the dielectric layer 504 is reached, thereby defining the seed layer 506. Further, the seed layer 506 may be formed by using a deposition process such as, for example, CVD, PVD, some other suitable deposition process(es), or any combination of the foregoing.

Figure 11:
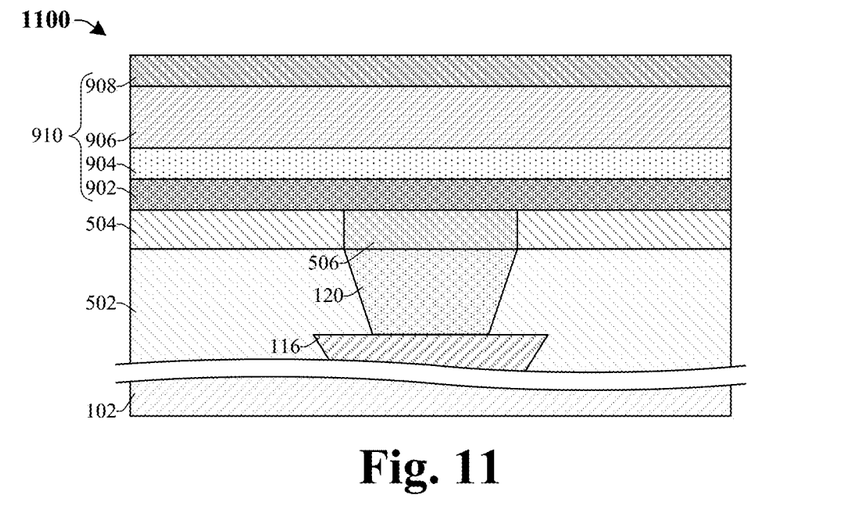

As shown in cross-sectional view 1100, a stack of memory layers 910 is formed over the dielectric layer 504 and the seed layer 506. The stack of memory layers 910 includes a second ferromagnetic film 902, a bottom electrode layer 904, a data storage structure 906, and a first ferromagnetic film 908. In some embodiments, the above layer(s) and/or structure(s) may be formed by using a deposition process such as, for example, CVD, PVD, some other suitable deposition process(es), or any combination of the foregoing.

Figure 12:
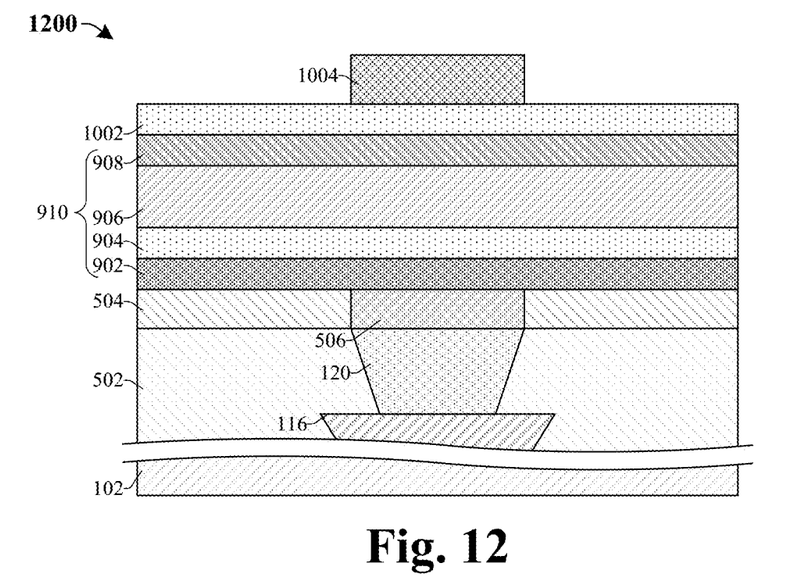

As shown in cross-sectional view 1200, a top electrode layer 1002 is deposited over the stack of memory layers 910. A masking layer 1004 is deposited over the top electrode layer 1002. In some embodiments, the masking layer 1004 may, for example, be a photoresist, a hard masking layer, or the like. The masking layer 1004 covers a center region of the top electrode layer 1002 and leaves a peripheral region of the top electrode layer 1002 exposed. In some embodiments, the above layers may be formed by using a deposition process such as, for example, CVD, PVD, some other suitable deposition process(es), or any combination of the foregoing.

Figure 13:
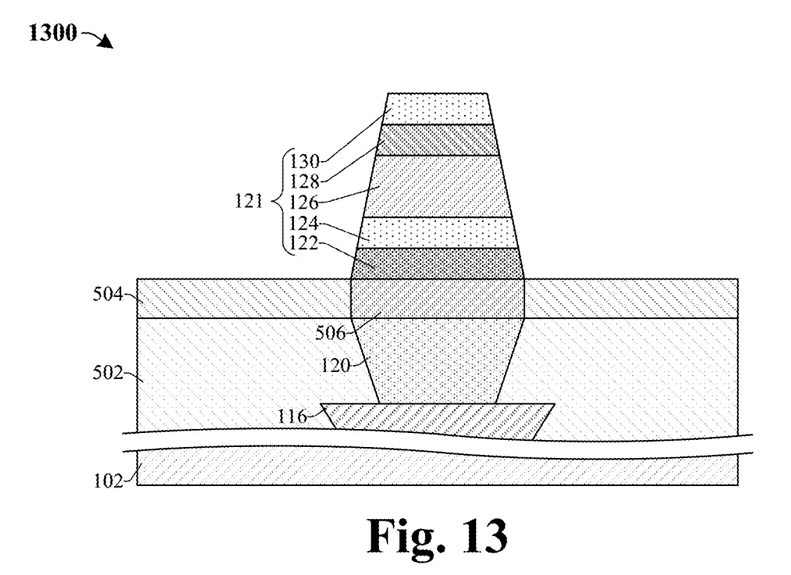

As shown in cross-sectional view 1300, the top electrode layer (1002 of FIG. 12) and the stack of memory layers (910 of FIG. 12) are patterned according to the masking layer (1004 of FIG. 12), thereby defining a memory cell 121. In some embodiments, the patterning process includes exposing unmasked regions of the top electrode layer (1002 of FIG. 12) and the stack of memory layers (910 of FIG. 12) to one or more etchants. The patterning process may, for example, include one or more etching processes, such as a plasma etch and/or a wet etch. The memory cell 121 includes a second ferromagnetic layer 122, a bottom electrode 124, a data storage layer 126, a first ferromagnetic layer 128, and a top electrode 130.

Figure 14:
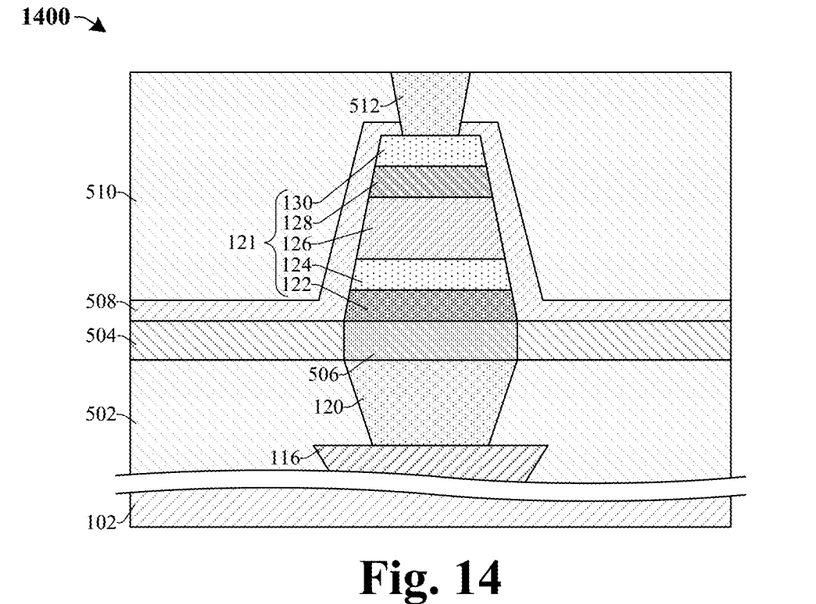

As shown in cross-sectional view 1400, a sidewall spacer 508 is formed over the memory cell 121. A first ILD layer 510 is formed over the sidewall spacer 508. A top electrode via 512 is formed within the first ILD layer 510 and contacts an upper surface of the memory cell 121. In some embodiments, the top electrode via 512 may be formed by a damascene process.

Figure 15:
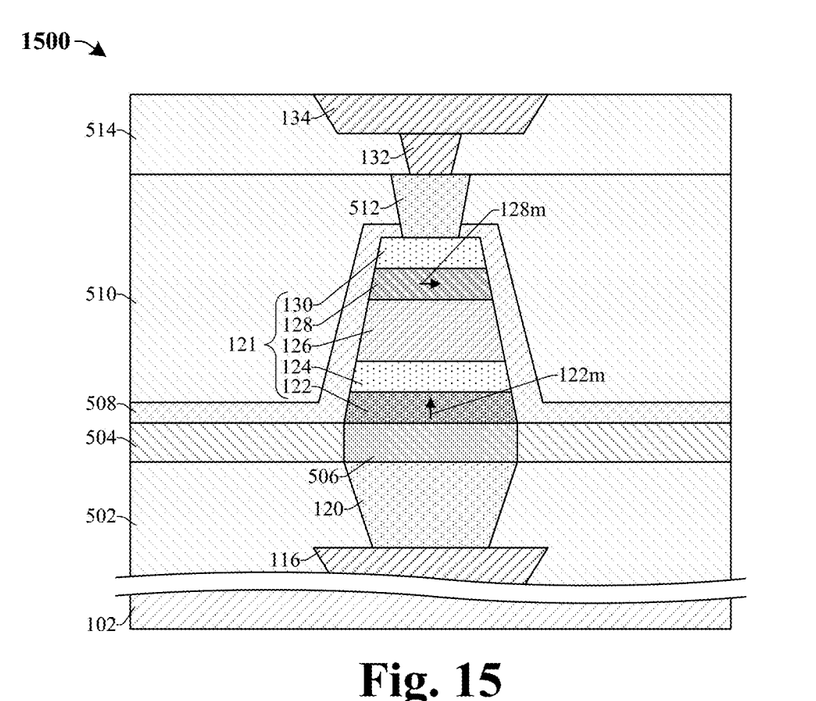

As shown in cross-sectional view 1500, a second ILD layer 514 is formed over the first ILD layer 510. An upper interconnect via 132 and an upper interconnect wire 134 are formed in the second ILD layer 514. In some embodiments, the upper interconnect via and wire 132, 134 are formed by a damascene process.

In some embodiments, the first ferromagnetic film (908 of FIG. 11) and the second ferromagnetic film (902 of FIG. 11) may be deposited as material having specific magnetizations. In other embodiments, a magnetic orientation set step is performed such that the first ferromagnetic layer 128 has a first magnetization 128*m* orthogonal to a second magnetization 122*m* of the second ferromagnetic layer 122. The first magnetization 128*m* points in a first direction that is parallel to a bottom surface of the data storage layer 126. The second magnetization 122*m* points in a second direction that is orthogonal to the bottom surface of the data storage layer 126, such that the second magnetization 122*m* is orthogonal to the first magnetization 128*m*. In some embodiments, the magnetic orientation set step may be performed after forming the upper interconnect via and wire 132, 134. In further embodiments, the magnetic orientation set step may be performed after forming the memory cell 121 in FIG. 13 and before forming the sidewall spacer 508 in FIG. 14. In some embodiments, a first magnetic orientation set step may be performed after forming the second ferromagnetic film (902 of FIG. 11) and a second magnetic orientation set step may be performed after forming the first ferromagnetic film (902 of FIG. 11).

In some embodiments, the magnetic orientation set step includes exposing the first and second ferromagnetic layers 128, 122 to one or more external magnetic fields, thereby orienting and/or setting the first and second magnetizations 128*m*, 122*m* in their respective directions. For example, the second ferromagnetic layer 122 may have a plurality of magnetic domains distributed throughout the material of the second ferromagnetic layer 122. Before performing the magnetic orientation set step, the plurality of magnetic domains each have a magnetization pointing in a random direction, such that a first magnetic field from a first magnetic domain may cancel with a second magnetic field from a second magnetic domain. This, in part, may result in a net-zero magnetic field from the second ferromagnetic layer 122. After performing the magnetic orientation set step, the magnetic field of each magnetic domain in the second ferromagnetic layer 122 point in the second direction, such that a first magnetic field from a first magnetic domain may constructively add with a second magnetic field from a second magnetic domain. This, in part, results in the second ferromagnetic layer 122 having a second magnetization pointing in the second direction (e.g., towards the data storage layer 126).

Figure 16:
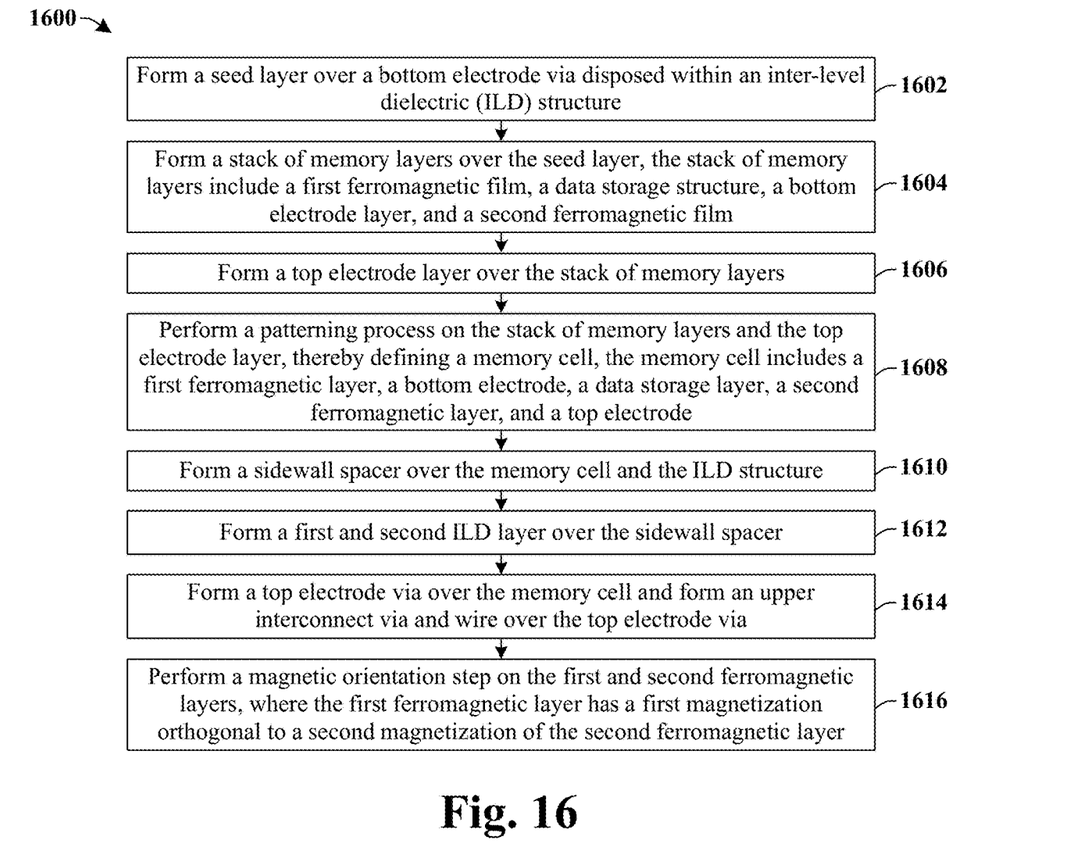
FIG. 16 illustrates a methodology in flowchart format that illustrates some embodiments of a method of forming a memory device, according to the present disclosure.

FIG. 16 illustrates a method 1600 of forming a memory device in accordance with some embodiments of the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, a seed layer is formed over a bottom electrode via that is disposed within an inter-level dielectric (ILD) structure. FIG. 10 illustrates a cross-sectional view 1000 corresponding to some embodiments of act 1602.

At act 1604, a stack of memory layers is formed over the seed layer, the stack of memory layers include a first ferromagnetic film, a data storage structure, a bottom electrode layer, and a second ferromagnetic film. FIG. 11 illustrates a cross-sectional view 1100 corresponding to some embodiments of act 1604.

At act 1606, a top electrode layer is formed over the stack of memory layers. FIG. 12 illustrates a cross-sectional view 1200 corresponding to some embodiments of act 1606.

At act 1608, a patterning process is performed on the stack of memory layers and the top electrode layer, thereby defining a memory cell. The memory cell includes a first ferromagnetic layer, a bottom electrode, a data storage layer, a second ferromagnetic layer, and a top electrode. FIG. 13 illustrates a cross-sectional view 1300 corresponding to some embodiments of act 1608.

At act 1610, a sidewall spacer is formed over the memory cell and the ILD structure. FIG. 14 illustrates a cross-sectional view 1400 corresponding to some embodiments of act 1610.

At act 1612, a first and second ILD layer are formed over the sidewall spacer. FIGS. 14 and 15 illustrate cross-sectional views 1400 and 1500 corresponding to some embodiments of act 1612.

At act 1614, a top electrode via is formed over the memory cell. An upper interconnect via and wire are formed over the top electrode via. FIGS. 14 and 15 illustrate cross-sectional views 1400 and 1500 corresponding to some embodiments of act 1614.

At act 1616, a magnetic orientation step is performed on the first and second ferromagnetic layers, such that the first ferromagnetic layer has a first magnetization orthogonal to a second magnetization of the second ferromagnetic layer. FIG. 15 illustrates a cross-sectional view 1500 corresponding to some embodiments of act 1616.

Accordingly, in some embodiments, the present disclosure relates to a memory cell including a first ferromagnetic layer, a second ferromagnetic layer, and a data storage layer overlying the first ferromagnetic layer. The first ferromagnetic layer has a first magnetization orthogonal to a second magnetization of the second ferromagnetic layer.

In some embodiments, the present application provides a memory cell including a bottom electrode via overlying a substrate; a bottom electrode overlying the bottom electrode via; a data storage layer overlying the bottom electrode; a first ferromagnetic layer overlying the data storage layer and having a first magnetization pointing in a first direction; and a second ferromagnetic layer overlying the bottom electrode via and having a second magnetization pointing in a second direction orthogonal to the first direction.

In some embodiments, the present application provides a memory device including one or more lower interconnect layers overlying a substrate, wherein the one or more lower interconnect layers comprise a bottom electrode via; a resistive random access memory (RRAM) cell overlying the bottom electrode via, wherein the RRAM cell includes a bottom electrode overlying the bottom electrode via; a data storage layer overlying the bottom electrode; a first ferromagnetic layer overlying the data storage layer and having a first magnetization pointing in a first direction; and a second ferromagnetic layer overlying the bottom electrode via and having a second magnetization pointing in a second direction different than the first direction.

In some embodiments, the present application provides a method for forming a memory device, the method includes forming a bottom electrode via over a substrate; forming a data storage structure over the bottom electrode via; forming a first ferromagnetic film over the data storage structure, wherein the first ferromagnetic film is configured to have a first magnetization; forming a second ferromagnetic film over the bottom electrode via, wherein the second ferromagnetic film is configured to have a second magnetization that is orthogonal to the first magnetization; and patterning the first ferromagnetic film, the data storage structure, and the second ferromagnetic film to define a memory cell that includes a first ferromagnetic layer, a second ferromagnetic layer, and a data storage layer underlying the first ferromagnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a bottom electrode via overlying a substrate;
   a bottom electrode overlying the bottom electrode via;
   a data storage layer overlying the bottom electrode;
   a first ferromagnetic layer overlying the data storage layer and having a first magnetization pointing in a first direction; and
   a second ferromagnetic layer overlying the bottom electrode via and having a second magnetization pointing in a second direction orthogonal to the first direction, wherein the second ferromagnetic layer is disposed between the bottom electrode via and the bottom electrode.

2. The memory cell according to claim 1, wherein the first ferromagnetic layer comprises a first magnetic material and the second ferromagnetic layer comprises a second magnetic material, wherein the first magnetic material and the second magnetic material are different than a material of the bottom electrode.

3. The memory cell according to claim 2, wherein the first magnetic material comprises cobalt, the second magnetic material comprises nickel or iron, and the bottom electrode comprises copper, tantalum, or titanium.

4. The memory cell according to claim 1, wherein a bottom surface of the data storage layer is disposed along a horizontal line, wherein the first direction is parallel to the horizontal line and the second direction is orthogonal to the horizontal line.

5. The memory cell according to claim 1, wherein a bottom surface of the first ferromagnetic layer is in direct contact with a top surface of the data storage layer, wherein a top surface of the bottom electrode is in direct contact with a bottom surface of the data storage layer.

6. The memory cell according to claim 1, wherein the second ferromagnetic layer overlies the first ferromagnetic layer.

7. The memory cell according to claim 1, wherein an orientation of the first magnetization and an orientation of the second magnetization remain the same while performing a set or reset operation on the memory cell.

8. The memory cell according to claim 1, wherein the first ferromagnetic layer comprises a single magnetic material and the second ferromagnetic layer comprises an alternating stack of a first conductive material and a second conductive material.

9. The memory cell according to claim 1, wherein the data storage layer comprises a dielectric material.

10. A memory device comprising:
one or more lower interconnect layers overlying a substrate, wherein the one or more lower interconnect layers comprise a bottom electrode via;
a resistive random access memory (RRAM) cell overlying the bottom electrode via, wherein the RRAM cell comprises:
a bottom electrode overlying the bottom electrode via;
a data storage layer overlying the bottom electrode;
a first ferromagnetic layer overlying the data storage layer and having a first magnetization pointing in a first direction; and
a second ferromagnetic layer overlying the bottom electrode via and having a second magnetization pointing in a second direction different than the first direction.

11. The memory device according to claim 10, wherein the first direction is orthogonal to the second direction.

12. The memory device according to claim 10, wherein the first direction is parallel with a bottom surface of the data storage layer and the second direction is orthogonal to the bottom surface of the data storage layer.

13. The memory device according to claim 10, wherein the first ferromagnetic layer is in contact with a top surface of the data storage layer, wherein the bottom electrode is in contact with a bottom surface of the data storage layer.

14. The memory device according to claim 10, wherein the first ferromagnetic layer comprises cobalt, the data storage layer comprises aluminum oxide or hafnium oxide, the bottom electrode comprises copper, tantalum, or titanium, and the second ferromagnetic layer comprises iron or nickel.

15. The memory device according to claim 10, wherein the second ferromagnetic layer includes a first conductive material overlying a second conductive material different than the first conductive material.

16. The memory device according to claim 15, wherein the first conductive material is cobalt or iron, and the second conductive material is nickel, platinum, or palladium.

17. The memory device according to claim 10, wherein the second ferromagnetic layer is disposed between the bottom electrode via and the bottom electrode.

18. A memory device comprising:
a bottom electrode via overlying a substrate;
a resistive random access memory (RRAM) cell overlying the bottom electrode via, wherein the RRAM cell comprises a bottom electrode overlying the bottom electrode via, a data storage layer overlying the bottom electrode, a first ferromagnetic layer, and a second ferromagnetic layer disposed between the bottom electrode via and the data storage layer, wherein the bottom electrode comprises a non-magnetic material different than a first magnetic material of the first ferromagnetic layer and a second magnetic material of the second ferromagnetic layer, wherein opposing sidewalls of the first ferromagnetic layer, opposing sidewalls of the second ferromagnetic layer, and opposing sidewalls of the data storage layer are aligned; and
a top electrode via overlying the RRAM cell, wherein the first ferromagnetic layer is disposed between the top electrode via and the data storage layer.

19. The memory device according to claim 18, wherein the opposing sidewalls of the first ferromagnetic layer, the opposing sidewalls of the second ferromagnetic layer, and the opposing sidewalls of the data storage layer are slanted relative to a top surface of the bottom electrode via.

20. The memory device according to claim 18, further comprising:
a seed layer disposed between a bottom surface of the second ferromagnetic layer and a top surface of the bottom electrode via.

* * * * *